(12) United States Patent
Takekoshi (10) Patent No.: US 6,359,455 B1
(45) Date of Patent: Mar. 19, 2002

(54) PROBING CARD

(75) Inventor: Kiyoshi Takekoshi, Nishiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/511,315

(22) Filed: Feb. 23, 2000

(30) Foreign Application Priority Data

Feb. 25, 1999 (JP) .......................................... 11-049171

(51) Int. Cl.⁷ ........................ G01R 31/02; H01R 12/00
(52) U.S. Cl. ........................ 324/754; 324/762; 439/66
(58) Field of Search ......................... 324/754, 762, 324/761, 158.1, 765, 757, 756; 439/66, 81, 71; 200/245, 257

(56) References Cited

U.S. PATENT DOCUMENTS

| | | | |
|---|---|---|---|
| 5,625,298 A | | 4/1997 | Hirano et al. |
| 5,828,226 A | * | 10/1998 | Higgins et al. .............. 324/762 |
| 6,016,060 A | * | 1/2000 | Akram et al. ................ 324/757 |
| 6,086,386 A | * | 7/2000 | Fjelstad et al. ................ 439/70 |

* cited by examiner

*Primary Examiner*—Safet Metjahic
*Assistant Examiner*—Paresh Patel
(74) *Attorney, Agent, or Firm*—Oblon, Spivak, McClelland, Maier & Neustadt, P.C.

(57) ABSTRACT

A probing card is disclosed which checks the electrical characteristic of a plurality of electrical elements (for example, IC chips) by contacting probes with electrode pads of the IC chips formed on an object (for example, a wafer) to be checked. The probe has a prismatic projection provided on a substrate, a spacer fixed to a top end face of the prismatic projection, a volute-like plate having one end fixed to the spacer and having an elasticity and a probe pin fixed to the other end of the volute-like plate. The other end side of the volute-like plate is formed as a free end.

22 Claims, 5 Drawing Sheets

PROBING CARD

CROSS-REFERENCE TO RELATED APPLICATION

This application is based upon and claims the benefit of priority from the prior Japanese Patent Application No. 11-049171, filed Feb. 25, 1999, the entire contents of which are incorporated herein by reference.

BACKGROUND OF THE INVENTION

The present invention relates to a probing card used in checking the electrical characteristic of an object to be checked.

In the case where checking is made for the electrical characteristics of many electrical elements (IC chips of memory circuits, logic circuits, etc.) formed on a to-be-checked object (for example, semiconductor wafer-hereinafter referred to simply as a wafer), a probing card can be used as a contactor. The probing card allows a transfer of a checking signal between a tester connected to the probing card and an electrical element by setting its probe pins in a state contacting with electrode pads of the electrical element on the wafer. The probing card was so arranged as to correspond to, for example, a plurality of electrode pads of the electrical element on the wafer. The probing card has a plurality of wire type probes, and the probe pins of the respective probes and electrode pads are electrically connected together.

In recent years, with a higher and higher integration density of such an IC chip, the number of electrode pads on the IC chip has been rapidly increased and the array of the electrode pads has been increasingly narrower in pitch. With this trend, the number of probes of the probing card has also been rapidly increased and their array has been correspondingly made narrower in pitch. With a recent increase in the size of the wafer, the number of IC chips to be formed in a single wafer has been rapidly increased and it has been taken a long time to check respective IC chips. Therefore, an important task is to reduce this checking time. In the checking by the probing card, a plurality of IC chips are checked at a time in many cases instead of individually checking them on a one-to-one basis. By increasing the number of IC chips to be checked once at a time (once-at-a-time checking IC's), a checking time is shortened. As an example of a probing card handling an increasing number of pins and an increase of the once-at-a-time checking ICs, there is a membrane type probing card having bump-like probes. This kind of probing card can be made higher in integration density so as to correspond to miniaturized IC chips but the probe itself has no elasticity. For this reason, when the probe is made higher in integration density and probe-to-probe dimension becomes very shorter, it is difficult to let the membrane follow a high/low difference between the respective electrode pads. As a result, there is a problem that it becomes difficult to secure stable contact between the probe and the electrode pad of the IC chip.

Figure 7:
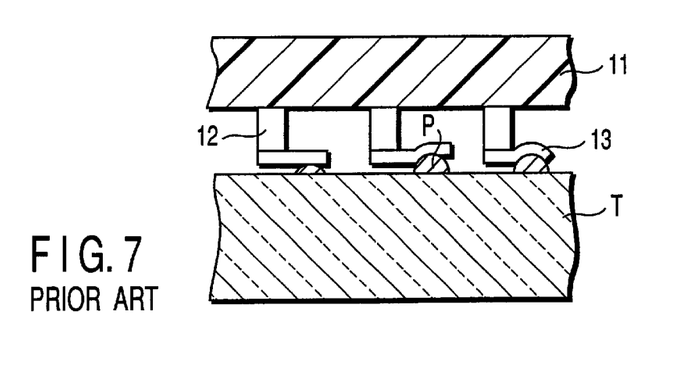
FIG. 7 is a plan view for explaining the operation of the probe of a conventional probing card.

U.S. Pat. No. 5,828,226 describes an example of a probing card solving the above-mentioned problem of the membrane type probing card. A probe 10 of this probing card has, as shown in FIG. 7, a post 12 mounted upright on a substrate 11 and a beam 13 supported by the post 12 in a cantilevered state. The high/low difference of the electrode pads P of an IC chip T is absorbed by an elastic deformation of the beam 13.

The probing card described in the U.S. Pat. No. 5,828,226 enables the IC chips to be formed in a high integration density and secures better contact with the electrode pad. Since, however, the beam 13 is extended from the post 12, the array of probes 10 has to be so designed as to prevent interference (contact) with an adjacent probe 10 when the probes 10 are arranged. This arrangement had a limitation to securing a high integration density structure.

BRIEF SUMMARY OF THE INVENTION

The present invention has been achieved to solve the above-mentioned problems.

An object of the present invention is to provide a probing card which can achieve a high integration density of probes and increase the number of them in accordance with an array of electrodes higher in density and greater in number resulting from a higher integration density of elements (electrical elements on a to-be-checked object) and an increase in the number of once-at-a-time checking elements (ICs).

Another object of the present invention is to provide a probing card which can set all probes in a state positively contacting with corresponding electrodes of an element and effect checking with high reliability.

In one aspect of the present invention, there is provided a probing card for checking electrical characteristics of electrical elements by contacting a plurality of probe pins with these electrical elements formed on an object to be checked, comprising a substrate and a plurality of probes mounted on the substrate, the probe having a post-like projection provided on the substrate, a volute-like plate having one end fixed to the post-like projection and the other end formed as an elastic free end, and a probe pin fixed to the other end side of the volute-like plate.

In the probing card, the one-end side of the volute-like plate is preferably fixed to the post-like projection through a spacer.

In the probing card, respective probes are preferably arranged at such an interval that their volute-like plates are not contacted with each other.

In the probing card, the volute-like plate preferably has a volute structure in which its high frequency characteristic is not inhibited.

In the probing card, the probe pin is preferably arranged on the other end side of the volute-like plate such that the probe pin is situated in a space on a top end face of the post-like projection.

In the probing card, it is preferable that an outer side end of the volute-like plate be fixed to the post-like projection and an inner side end of the volute-like plate be formed as the free end.

In the probing card, the probe pin preferably has a projection of a conical or prismatic structure.

In the probing card, the post-like projection is so formed as to have a horizontal cross-section width dimension of a few tens to a few hundreds of $\mu$m.

In a second aspect of the present invention, there is provided a probing card for checking the electrical characteristics of integrated circuits by contacting a plurality of probe pins with electrode pads of these integrated circuits formed on a semiconductor wafer, comprising a substrate and a plurality of probes provided on the substrate, the respective probe having a post-like projection provided on the substrate, a spacer provided on the post-like projection, a volute-like plate having one end fixed to the spacer and the other end formed as an elastic free end, and a probe pin fixed to the other end side of the volute-like plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be explained below on the basis of embodiments as shown in FIGS. 1A to 6E.

Figure 3:
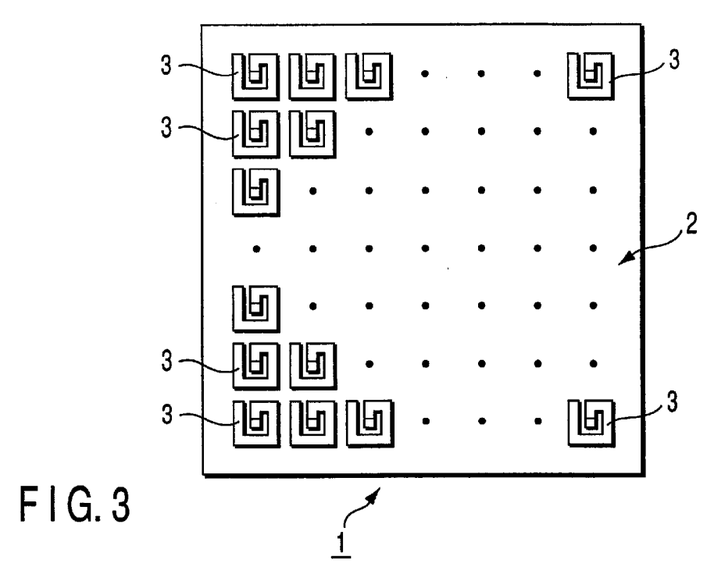
FIG. 3 is a plan view showing, as a model, a probing card having those probes as shown in FIG. 1.

An example of a probing card 1 of an embodiment has a substrate 2 and probes 3 as shown in FIG. 3. The probes 3 are arranged, for example, in a matrix array on a surface of the substrate 2 to correspond to electrode pads P (FIG. 7) of an IC chip and many probes (for example, about 2000 probes) are provided so as to enable a plurality of IC chips to be checked at a time. The array of the probes 3 corresponds to the array of the electrode pads P and is not restricted to the array shown in FIG. 3. The substrate 2 is made up of, for example, ceramics with a plurality of connection layers and, through connection lines in the substrate, the probes 3 on the surface of the substrate are connected to the electrode pads on a rear surface side. A base end of the probe 3 is electrically connected to a corresponding one of those electrode pads 21 arranged in a matrix array on the surface of the substrate.

Figures 1A, 1B:
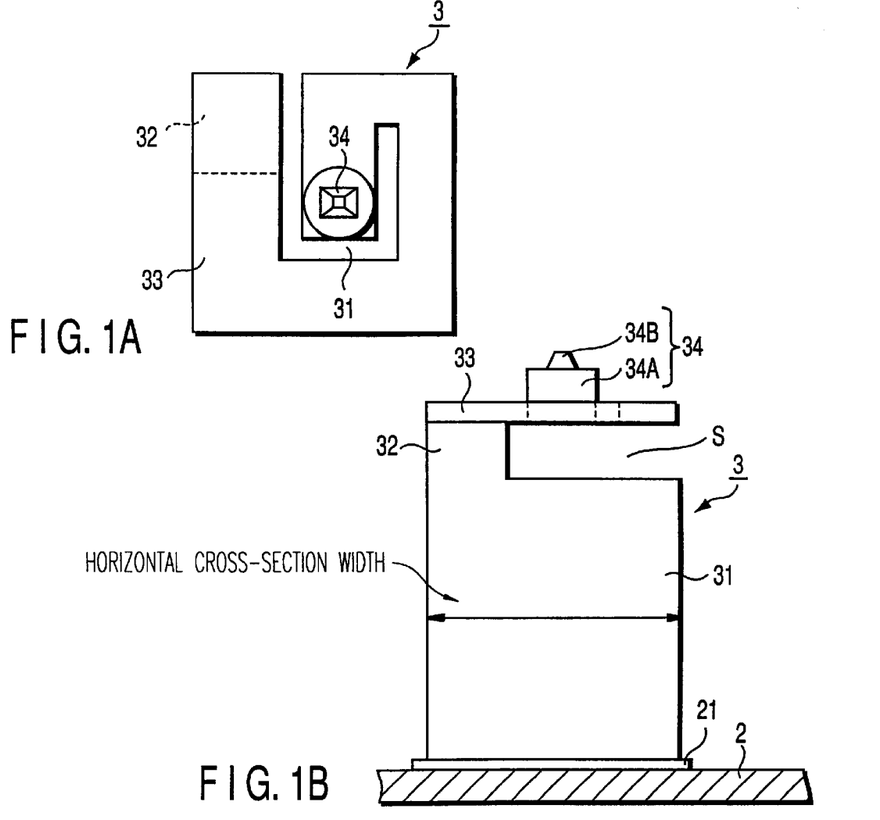
FIG. 1A is a plan view showing a probe of a probing card according to one embodiment of the present invention.
FIGS. 1B, 1C are side views each showing a probe of a probing card according to another embodiment of the present invention.
Figure 1C:
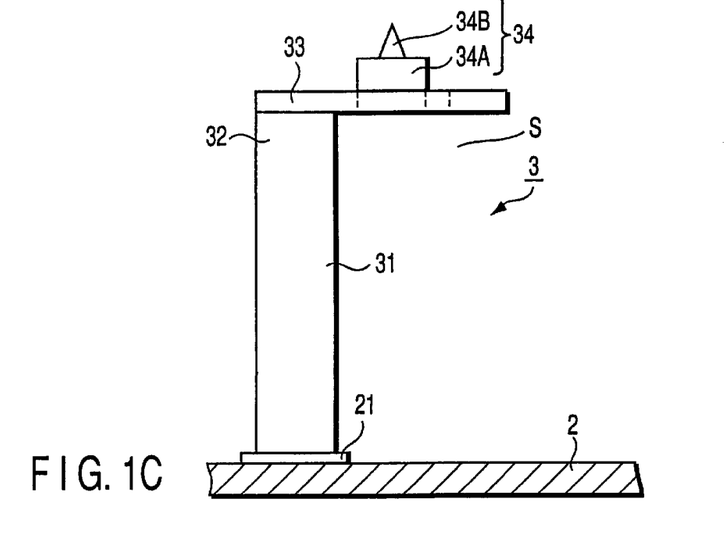

The probe 3 can have, as shown in FIGS. 1A, 1C for example, a post-like projection (for example, a prismatic projection, a projection concave in cross-section, etc.) 31 mounted upright on the electrode pad 21 and assuming a substantially square-like planar surface, a volute-like plate 33 fixed at one end to a corner side of a top end face of the post-like projection 31 and having an elasticity, and probe pins (for example, a conical or prismatic body) 34 fixed to the other end of the volute-like plate 33. As shown in FIG. 1B, in the case where the post-like projection 31 is made to have a relatively large size, a spacer (for example, a prismatic spacer) 32 is preferably provided between the top end face of the post-like projection 31 and one end of the volute-like plate 33. The other end of the volute-like plate 33 provides a free end. The probe 3 as a whole can be made of, for example, nickel or its alloy.

The post-like projection 31 can be formed to be matched to the size of the electrode pad of the IC chip. The one side of the post-like projection 31 is made to have a length of about a few tenths to a few hundreds of $\mu$m (for example, 50 to 200 $\mu$m is preferable, about 100 $\mu$m is more preferable). The volute-like plate 33 can be so formed as to be turned from an outside toward an inside in a spiral way with the spacer 32 as a base point as shown in FIG. 1A. The volute-like plate 33 can be spirally (for example, clockwise or counter-clockwise) formed in accordance with the configuration of the top end face of the post-like projection 31 while maintaining a parallel relation to the top end face of the post-like projection 31. Those adjacent probes 3 are preferably arranged at such an interval that their volute-like plates 33 are not contacted with each other. The other end (extending end) of the volute-like plate 33 is formed as a free end and a probe pin 34 can be fixed to the free end of the plate 33. It is preferable that the probe pin 34 be positioned substantially at a center on the top end face of the post-like projection 31. A space S between the top end face of the post-like projection 31 and the free end of the volute-like plate 33, as shown in FIGS. 1B, 1C, is formed as a moving space when the probe pin 34 is overdriven toward the electrode pad. The probe pin 34 comprises a post-like section (post-like projection) 34A such as a cylindrical or prismatic section, and a projection (frusto-pyramidal section) 34B fixed to the top end face of the post-like section and having a conical, a pyramidal or other configuration. The axes of the post-like projection 31, post-like section 34A and projection 34B, though being shown substantially aligned in the Figures, are not necessarily required to be aligned with respect to each other. Although, in the present embodiment, the probe pin 34 has been explained as comprising the post-like section 34A and projection 34B, the probe pin 34 of the present invention can be formed of either one of these.

Figure 2A:
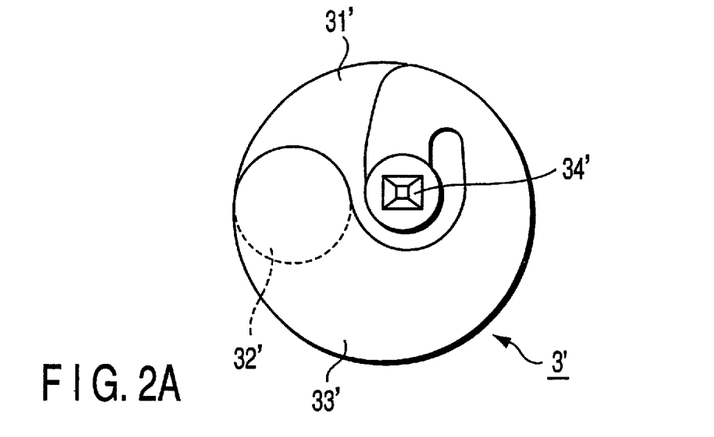
FIG. 2A is a plan view showing a probe of a probing card according to another embodiment of the present invention.
Figure 2B:
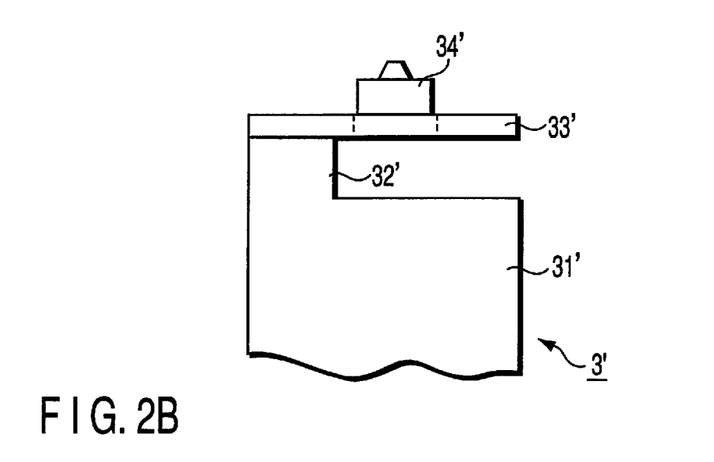
FIGS. 2B, 2C show, each, a major section of the probe of the probing card according to another embodiment of the present invention.
Figure 2C:
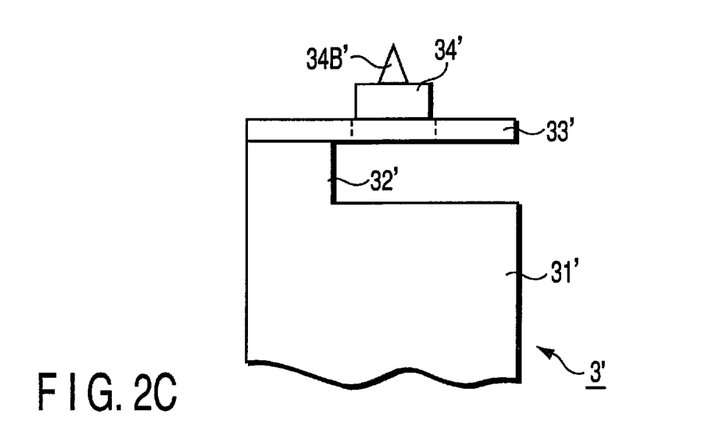

FIGS. 2A, 2B and 2C show a probe according to another embodiment of the present invention. This probe 3' has a post-like projection (for example, cylindrical projection) 31', a spacer (for example, cylindrical spacer) 32', a volute-like plate (for example, a circular plate) 33' and a probe pin 34'. This probe can be formed similarly to the probe of the above-mentioned embodiment except that it is formed as being cylindrical as a whole. As shown in FIG. 2C, the forward end of the projection 34B' of the probe pin 34' can be so made as to have a pointed tip (whose size is 1–2 $\mu$m for example).

The probes 3 as shown in FIGS. 1A, 1B, and 1C can be arranged in a matrix array, as shown in FIG. 3, on a substrate 2 made of ceramics. This probe 3 serves as a section for allowing a checking signal of the probing card 1 to be input and output. To a rear surface of the substrate 2 a relay board (not shown) made of, for example, ceramics is connected and it is greater than the substrate 2 and has a multi-layered structure. Through this relay board the respective probe 3 is connected to a printed wiring board (not shown). At the central area of the surface of the relay board, the probe pins contacting with electrode pads (corresponding to the probes 3) on the rear surface of the substrate 2 are arranged, for example, in a matrix array. Electrode pads are formed on the rear surface of the relay board and, through multi-layered connection lines, connected to the respective probe pins. By enlarging the array of the respective probes 3 on the substrate 2, the relay board connects the respective probes 3 to the printed wiring board. The probing card 1 comprises the substrate 2 having the probes 3, relay board and printed wiring board, that is, is configured as a card integral with these and is connected through the printed wiring board to a tester side.

A sequence for forming the above-mentioned probe 3 on the substrate 2 will now be explained below by way of example. After a probe pin 34 has been formed by the steps shown in FIGS. 5A to 5D, a volute-like plate 33, spacer 32 and post-like projection 31 are formed by the steps 6A to 6E and then these are transferred to a substrate 2. These steps will be performed as will be set out below.

Figure 5A:
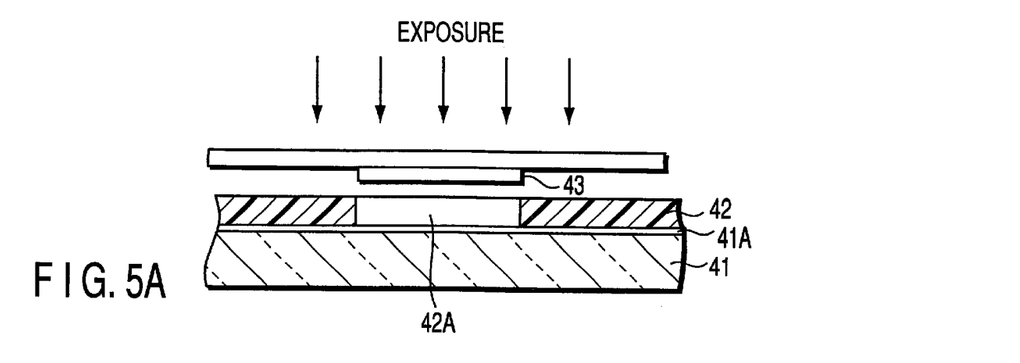
FIGS. 5A to 5D are explanatory views showing the steps of manufacturing probe pins of a probe as shown in FIG. 1.
Figure 5B:
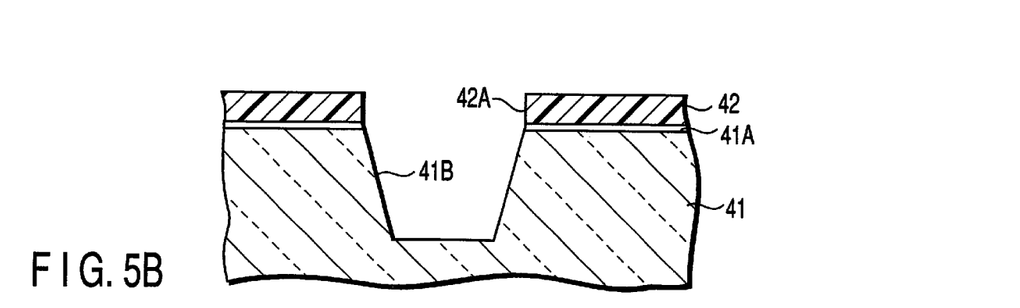
Figure 5C:
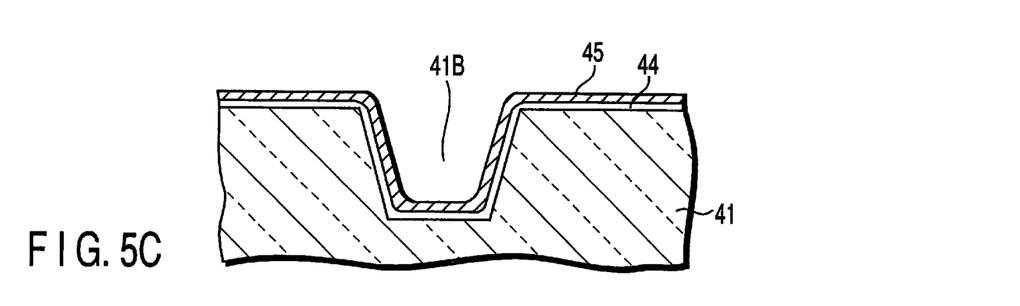
Figure 5D:
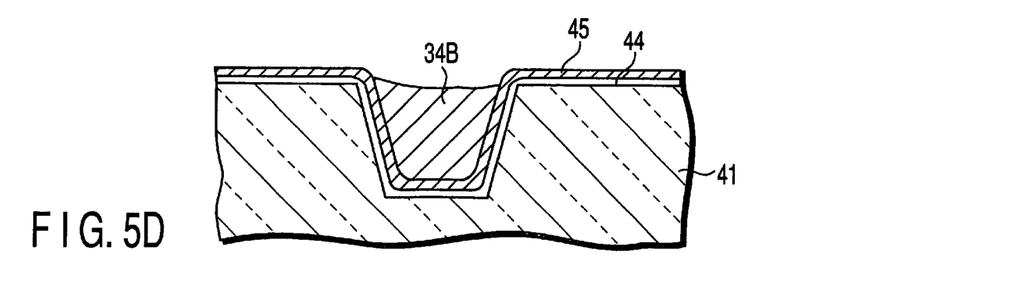

The above-mentioned probe 3 can be manufactured with the use of, for example, a LIGA (Lithographie, Galvanofomung, Abformung) process. As shown in FIG. 5A, a silicon oxide film 41A is formed on the surface of a substrate (for example, a silicon substrate) 41. Thereafter, a resist film 42 is coated to a surface. The silicon substrate 41 is exposed with light both in accordance with an array of the probe 3 and through a photomask 43 having a pattern of a projection (for example, a quadrangular pyramid) 34B. The resist film 42 is subjected to a developing process and a quadrangular hole 42A is formed in the resist film 42 as shown in FIG. 5A. The silicon oxide film 41A corresponding to the hole 42A is removed. An anisotropic etching is performed on the silicon substrate 41 and, as shown in FIG. 5B, an inverted frusto-pyramidal hole 41B is formed as shown in FIG. 5B. The resist film 42 and silicon oxide film 41A are removed. As shown in FIG. 5C, an oxide film 44 is formed on the surface of the silicon substrate 41 and a titanium film 45 is formed on a resultant surface. A resist is coated and the resist film corresponding to the hole 41B is exposed with light and, through the developing process, the hole 41B is opened. Nickel or nickel alloy is sputtered and, as shown in FIG. 5D, the silicon and nickel alloy are buried into the hole 41B of the silicon substrate 41 and a projection (for example, a frusto-pyramidal section) 34B is formed. The silicon oxide film 44 serves as an isolation layer when the projection 34B is isolated from the hole 41B of the silicon substrate 41. The titanium film 45 provides a barrier layer for preventing the metal diffusion of the nickel or nickel alloy forming the projection 34B and an electrode for electroforming.

Figure 6A:
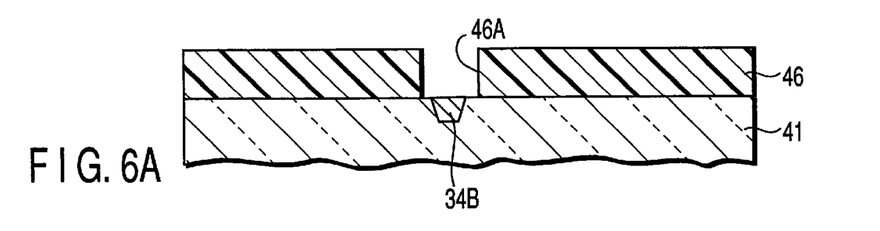
FIGS. 6A to 6E are an explanatory view diagrammatically showing the steps of forming a volute-like plate, spacer and prismatic projection on a probe pin of the probe as shown in FIG. 1.
Figure 6B:
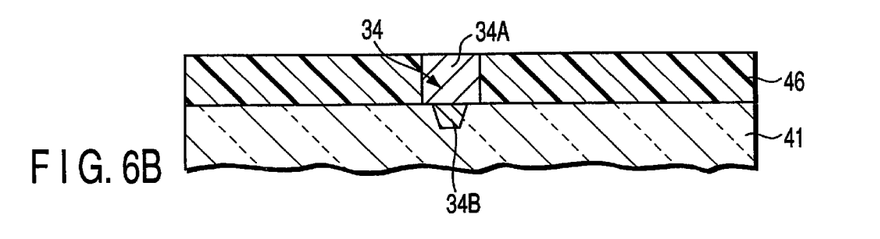
Figure 6C:
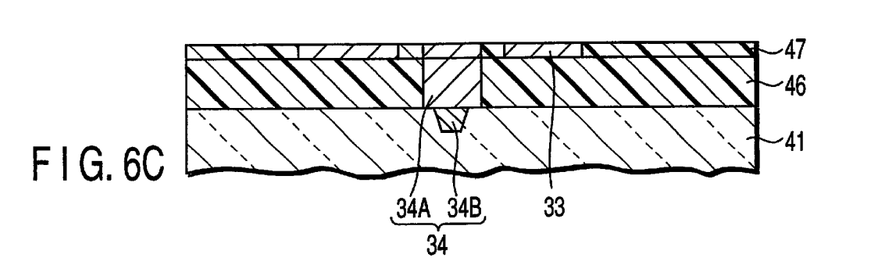
Figures 6D, 6E:
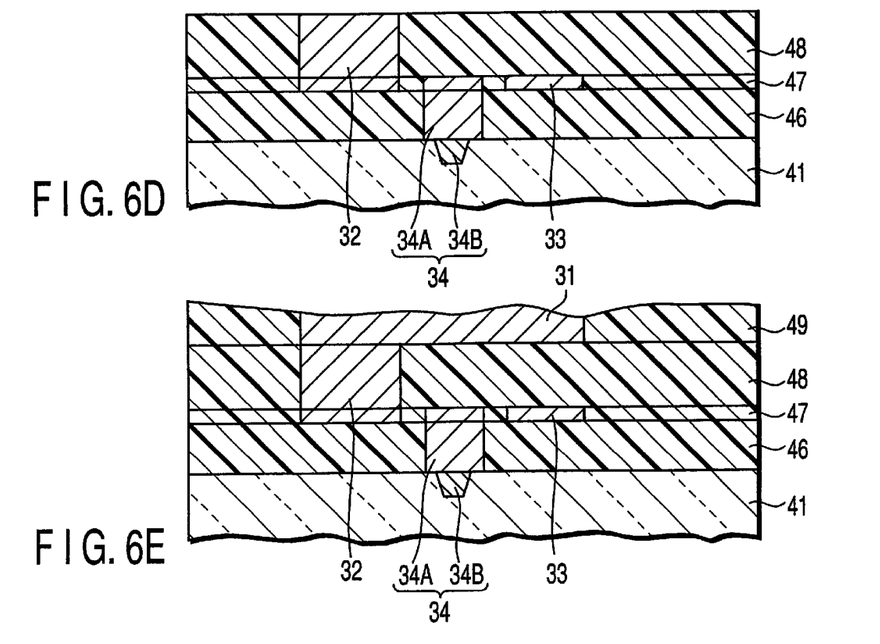

As shown in FIG. 6A, a resist of high transparency containing polymethylmethacrylate (PMKA) is coated on a surface of the silicon substrate 41 to provide a sacrificial layer 46. This sacrificial layer constitutes a dammy layer to be finally removed. Through a predetermined photomask, the sacrificial layer 46 is exposed with light and developed to provide a hole 46A for forming a post-like section 34A. By using the PMMA of high transparency, a light beam, such as an X-ray, passes through the sacrificial layer 46 in a straight way and a hole 46A of a high aspect ratio is formed. As shown in FIG. 6B, the hole 46A is buried, by an electroforming process, with nickel for example to provide a probe pin 34 integral with a cylindrical post-like section 34A. As shown in FIG. 6C, an isolation layer (not shown) comprised of a titanium film and sacrificial layer 47 formed by a PMMA containing resist are sequentially formed on the sacrificial layer 46 surface and surface of the post-like section 34A of nickel alloy as shown in FIG. 6B. Through the light-exposing and developing processes, an area corresponding to the post-like section 34A and area corresponding to the volute-like plate 33 are opened to provide a recess in the sacrificial layer 47 which corresponds to the volute-like plate 33. As shown in FIG. 6C, an electroforming process using nickel is carried out to provide a volute-like plate 33 integral with the probe pin 34. An isolation film (not shown) and sacrificial layer 48 are formed in the same sequence as the volute-like plate 33. Through the light exposing and etching processes, an electroforming process using the nickel is carried out to provide a spacer 32 as shown in FIG. 6D. In a similar sequence, an isolation layer and sacrificial layer 49 are sequentially formed over the surface shown in FIG. 6D and a light exposing an etching processes are done. Thereafter, through an electroforming process using nickel, a prismatic post-like projection 31 is formed as shown in FIG. 6E. Through such a series of the processes, probes 3 corresponding to the electrode pads on an electrical element (for example, an IC chip) can be formed on the surface 2. By transferring the respective probes 3 to the substrate 2, the respective post-like projections 31 (probe 3) of a silicon substrate 41 are connected to the electrode pads on the substrate 2. The above structure is treated by hydrofluoric acid, etc., to remove the isolation layer and sacrificial layers 46, 47, 48, 49 and the probes 3 integral with the substrate 2 are separated from the silicon substrate 41. And the substrate 2 and probes 3 of a probing card 1 are manufactured.

Figure 4:
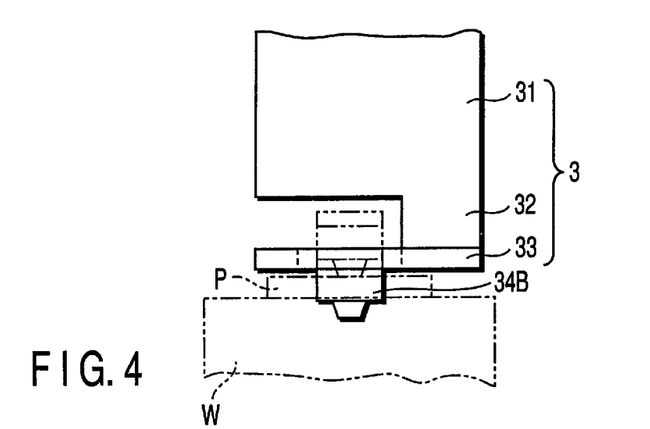
FIG. 4 is an explanatory view for explaining an operation of the probe as shown in FIG. 1.

An explanation will be given below about the operation of the probe 3 in the case where, for example, the probing card 1 is mounted on a probing apparatus. As shown in FIG. 4, the positioning of the probes 3 of the probing card 1 and electrode pads of the electrical element is carried out within the probing apparatus. By lifting a stage with the wafer set thereon, the electrode pads of a plurality of electrical elements formed on an object (for example, a wafer W) to be checked are contacted once at a time with the probes 3 of the probing card 1. By overdriving the stage, the probe 3 is lifted from a position as indicated by a solid line to a position as indicated by an imaginary line and the probe 3 is contacted with the electrode pad P under a needle pressure. Even if there is any high/low difference between the electrode pads on the wafer W, the volute-like plate 33 is elastically deformed in accordance with the height level of the electrode pad P and the high/low difference is absorbed and the projection 34B of the probe 3 is positively bitten into the respective electrode pad P under an elastic force of the volute-like plate 33 and electrically contacted with the electrode pad P. The tester is electrically connected to the respective elements and the respective electrical element is checked electrically. Thereafter, the stage is lowered and moved in an X- or Y-direction and the object to be checked is index-fed and the next following electrical rid elements are checked.

As set out above, according to the present embodiment, the probe 3 has the post-like projection 31 provided on the substrate 2, the volute-like plate 33 having one end fixed to the top end face of the post-like projection 31 preferably through a spacer 32 and having an elasticity, and the probe pin 34 fixed to the other end of the volute-like plate 33. Since the other end side of the volute-like plate 33 is formed as a free end, even if the number of electrode pads on the electrical element is increased due to the high integration density of the electrical elements and more number of once-at-a-time checking ICs and hence is integrated as a high density unit, probes can be integrated in high density in accordance with the array of the electrode pads and more number of such arrays can be obtained. All the probes 3 can be positively contacted with the electrode pads and checking can be made with high reliability.

According to the present embodiment, since the respective volute-like plates 33 of the respective probes 3 are arranged at an interval not contacting with each other, it is possible to manufacture probes corresponding to an array of the electrode pads on the electric pads. Further, since the volute-like plate 33 provides a turn (for example, one turn) falling within a range in which no high frequency characteristic is inhibited, it is possible to make stabler checking with less noise susceptibility. Since the probe pin 34 of the probe 3 is arranged at a substantially central area on the inner side of the top end face of the post-like projection 31, it is possible to achieve readier positioning relative to the electrode pad.

Although, in the respective embodiment, the probe 3 (probe 3') is prismatic or cylindrical in configuration, the probe of the present invention is not restricted to these configurations. Although the probe pin 34 (34') has been explained as having the post-like section 34A (34A') and projections 34B (34B'), the projection 34B (34B') or the post-like section 34A (34A') may be omitted. Further although the probes 3, 3' have been explained as being manufactured with the use of nickel, the probe material is not restricted to the nickel and they can be manufactured with other elastic metals (nickel alloy for example). The volute-like plate may be formed by an etching process or fine blunking process.

By forming electrical elements in high integration density on the object to be checked and achieving more number of once-at-a-time checking ICs, the number of electrodes with which the probes are contacted at one checking is increased and integrated in high density. According to the invention as claimed, a probing card is provided in which probes can be made to have a higher integration density and more number of their arrays in accordance with the array of the electrodes and highly reliable checking can be made with all the probes set in positive contact with the electrodes on the elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probing card for checking electrical characteristics of electrical elements formed on an object to be checked by contacting a plurality of probe pins with these electrical elements, comprising:
    a substrate; and
    a plurality of probes mounted on the substrate, each probe having a post-like projection provided on the substrate, a spring element having one end fixed to tie post-like projection and an other end formed as an elastic free end, and a respective probe pin fixed to the other end side of the spring element;
    wherein the spring element provides a volute-like structure in which its high frequency characteristic is not inhibited.

2. A probing card according to claim 1, wherein the one end of the spring element is fixed to the post-like projection through a spacer.

3. A probing card according to claim 1 or 2, wherein the probe pin is arranged on the other end of the spring element such that the probe pin is situated in a space on a top end face of the spring element.

4. A probing card according to claim 1 or 2, wherein an outer side end of the spring element is fixed to the post-like projection and an inner side end of the spring element is formed as a free end.

5. A probing card according to claim 1 or 2, wherein the probe pin has a projection having one of a conical and a prismatic structure.

6. A probing card according to claim 1 or 2, wherein the post-like projection is so formed as to have a horizontal cross-section width dimension of a few tens to a few hundreds of $\mu$m.

7. A probing card according to claim 1, wherein the other end of the volute-like place has a smaller width than a width of said one end of the volute-like plate.

8. A probing card according to claim 1, wherein the other end of the volute-like plate is located in a substantially center portion of the volute-like plate.

9. A probing card according to claim 1, wherein tie probe pin is fixed to the other end of the volute-like plate.

10. A probing card for checking electrical characteristics of electrical elements formed on an object to be checked by contacting a plurality of probe pins with these electrical elements, comprising:
    a substrate; and
    a plurality of probes mounted on the substrate, each probe having a post-like projection provided on the substrate, a volute-like plate having one end fixed to the post-like projection and the other end formed as an elastic free end, and a respective probe pin formed on the other end side of the volute-like plate.

11. A probing card according to claim 10, wherein the one end of the volute-like plate is fixed to the post-like projection through a spacer.

12. A probing card according to claim 10 or 11, wherein the respective probes are arranged at such an interval that their volute-like plates are not contacted with each other.

13. A probing card according to claim 10 or 11, wherein the volute-like plate provides a volute structure in which its high frequency characteristic is not inhibited.

14. A probing card according to claim 10 or 11, wherein the probe pin is arranged on the other end of the volute-like plate such that the probe pin is situated in a space on a top end face of the post-like projection.

15. A probing card according to claim 10 or 11, wherein an outer side end of the volute-like plate is fixed to the post-like projection and an inner side end of the volute-like plate is formed as a free end.

16. A probing card according to claim 10 or 11, wherein the probe pin has a projection having one of a conical or a prismatic structure.

17. A probing card according to claim 10 or 11, wherein the post-like projection is so formed as to have a horizontal cross-section width dimension of a few tens to a few hundreds of $\mu$m.

18. A probing card according to claim 10, wherein the other end of the volute-like plate has a smaller width than a width of said one end of the volute-like plate.

19. A probing card according to claim 10, wherein the other end of the volute-like plate is located in a substantially center portion of the volute-like plate.

20. A probing card according to claim 10, wherein the probe pin is fixed to the other end of the volute-like plate.

21. A probing card for checking electrical characteristics of semiconductor integrated circuits formed on a semiconductor wafer to be checked by contacting a plurality of probe pins with these semiconductor integrated circuits, comprising:

a substrate; and a plurality of probes mounted on the substrate, each probe having a post-like projection provided on the substrate, a volute-like plate having one end fixed to the post-like projection and the other end formed as an elastic free end, and a respective probe pin formed on the other end side of the volute-like plate.

22. A probing card for checking electrical characteristics of semiconductor integrated circuits formed on a semiconductor wafer to be checked by corntacting a plurality of probe pits with these semiconductor integrated circuits comprising:

a substrate; and a plurality of probes mounted on the substrate, each probe having a post-like projection provided on- the substrate, a spring element having one end fixed to the post-like projection and an other end formed as an elastic fee end, and a respective probe pin fixed to the other end side of the spring element;

wherein the spring element provides a volute-like structure in which its high frequency characteristic is not inhibited.

* * * * *